(12) United States Patent
Matsuki et al.

(10) Patent No.: US 6,631,692 B1
(45) Date of Patent: Oct. 14, 2003

(54) PLASMA CVD FILM-FORMING DEVICE

(75) Inventors: Nobuo Matsuki, Tama (JP); Yoshinori Morisada, Tama (JP)

(73) Assignee: ASM Japan K.K., Tama (JP)

(*) Notice: Subject to any disclaimer, the term of this patent is extended or adjusted under 35 U.S.C. 154(b) by 0 days.

(21) Appl. No.: 09/531,254

(22) Filed: Mar. 17, 2000

(30) Foreign Application Priority Data

Mar. 18, 1999 (JP) ............................................. 11-072944

(51) Int. Cl.⁷ ............................ C23C 16/00; H05H 1/00
(52) U.S. Cl. .............. 118/723 E; 118/728; 156/345.47; 156/345.51
(58) Field of Search .................. 118/723 E, 728, 118/723 MW, 723 I, 715; 156/345.47, 345.34, 345.51

(56) References Cited

U.S. PATENT DOCUMENTS

| | | | | |
|---|---|---|---|---|
| 5,439,524 A | * | 8/1995 | Cain et al. ............... | 118/723 E |
| 5,494,522 A | * | 2/1996 | Moriya et al. .............. | 118/719 |
| 5,628,869 A | * | 5/1997 | Mallon ....................... | 438/694 |
| 5,695,566 A | * | 12/1997 | Suzuki et al. ............ | 118/723 E |
| 5,804,089 A | * | 9/1998 | Suzuki et al. .................. | 216/71 |
| 5,925,226 A | * | 7/1999 | Hurwitt et al. ........ | 204/298.15 |
| 5,990,016 A | * | 11/1999 | Kim et al. .................... | 438/707 |
| 6,228,438 B1 | * | 5/2001 | Schmitt ....................... | 427/569 |
| 2002/0023590 A1 | * | 2/2002 | Storbeck | |

FOREIGN PATENT DOCUMENTS

| | | | | |
|---|---|---|---|---|
| JP | 5-21520 | * | 1/1993 | ........... C23C/16/46 |
| JP | 9-320799 | * | 12/1997 | ........... C23C/14/34 |
| JP | 11-176593 | * | 7/1999 | ........... C23C/16/50 |
| JP | 2000-269146 A | * | 9/2000 | ......... H01L/21/205 |

* cited by examiner

Primary Examiner—Parviz Hassanzadeh
(74) Attorney, Agent, or Firm—Knobbe Martens Olson & Bear LLP

(57) ABSTRACT

A plasma CVD film-forming device forms a film on a semiconductor substrate in such as way that the film quality and film thickness of a thin film becomes uniform. The plasma CVD film-forming device to form a thin film on a semiconductor substrate includes a vacuum chamber, a showerhead positioned within the vacuum chamber, and a susceptor positioned substantially in parallel to and facing the showerhead within the vacuum chamber and on which susceptor the object to be processed is loaded and the central part of the showerhead and/or the susceptor constitutes a concave surface electrode.

13 Claims, 7 Drawing Sheets

PLASMA CVD FILM-FORMING DEVICE

BACKGROUND OF THE INVENTION

1. Field of the Invention

This invention relates to a device for forming a thin film on a semiconductor substrate by the vapor growth method using plasma, and particularly it relates to a semiconductor processing device that is characterized by the shape of a showerhead and/or a susceptor.

2. Description of the Related Art

FIG. 1 outlines a conventional parallel-flat-plate type plasma CVD film-forming device. The conventional plasma CVD film-forming device comprises a vacuum chamber 1, a showerhead 2 positioned upright within the vacuum chamber substantially horizontally and a susceptor 3 positioned substantially in parallel and facing the showerhead within the vacuum chamber 1.

In the vacuum chamber 1, an exhaust port 5 leading to a vacuum pump (not shown) is used for vacuum exhausting the inside of the chamber.

At the base of the showerhead 2, multiple fine holes 11 for emitting a jet of material gas are positioned. The showerhead 2 is also linked to a material gas supply tank 6 through a line 10. On the line 10, a mass flow controller 8 for controlling a flow of the material gas is positioned. An RF power source 4 is also electrically connected to the showerhead 2, and functions as one side of the electrodes.

The susceptor 3 is normally an aluminum column within which a heater 14 is embedded. The susceptor 3 is supported by a support 12 and can be also rotated, for example, by a rotating mechanism. The susceptor 3 is also connected to ground 13 and functions as the other electrode. On the surface of the susceptor 3, a semiconductor substrate 9 is loaded and is fixed by vacuum fastening, etc.

Operation of the conventional plasma CVD film-forming device is explained below.

First, gas within the chamber 1 is vacuum exhausted by the vacuum pump from the exhaust port 5, and preferably a low pressure is maintained within the chamber 1.

Next, a preselected material gas flowing from the material gas supply tank 6 is controlled by the mass flow controller 8 at a preferable flow. A material gas controlled at a preferable flow is transported to the showerhead 2 through the line 10 and is jetted out from the multiple fine holes 11 provided at the base, toward the semiconductor substrate.

After a flow is stabilized, a radio-frequency (RF) electric field is generated between the showerhead connected to the RF power source and the susceptor 3 grounded to the earth 13. The above-mentioned material gas within the chamber 1 is ionized and a plasma state occurs. Atoms of the ionized material gas show a chemical reaction at a reaction region on the semiconductor substrate, and a desirable thin film is formed on the semiconductor substrate.

As a material gas, silicon source gasses such as $SiH_4$, $DM-DMOS[(CH_3)_2Si(OCH_3)_2]$ and TEOS, fluorine source gasses such as $C_2F_6$, oxidizing gasses such as oxygen and inert gasses such as Ar or He can be used.

The type and quality of a film formed on the surface of the semiconductor substrate 9 change according to the type, flow and temperature of the material gas, the RF frequency type, and the plasma's spatial evenness.

SUMMARY OF THE INVENTION

The evenness of a film formed on the semiconductor substrate and the evenness of plasma density at the reaction region are closely related. As shown in FIG. 1, a distance between the susceptor 3 and the showerhead 2, i.e., a distance between the semiconductor substrate 9 and the showerhead 2, is fixed for a conventional plasma CVD film-forming device. In general, in the parallel-flat-plate type plasma CVD film-forming device, an electric field intensity distribution generated between two plane electrodes (Ø250 mm) has the property of being strongest at the center and gradually weakening toward the outer edge along a radius. In the film-forming region of a semiconductor substrate of Ø200 mm, the intensity distribution is approximately ±5%. Consequently, the electric field around the center of the semiconductor substrate 9 is relatively stronger than the electric field toward the outer edge along the radius, and the plasma density is also higher and the reaction of a material gas becomes more active. As a result, a thin film formed becomes thicker at the center, and the film quality becomes uneven at the center and at the outer area of the center.

This problem conventionally has been dealt with by controlling the flow or mixing ratio of gas supplied, the value of RF frequency applied and RF power energy. However, when these parameters are changed, the quality of the generated film and the film-forming speed change and stability of the process deteriorates. Particularly, if the mixing ratio and the flow of a material gas considerably affect the film quality, this problem becomes more serious.

It is important to resolve the problem of the evenness of a film due to the need for a larger diameter for semiconductor substrates in the future.

Consequently, an object of this invention is to provide a plasma CVD film-forming device that forms a thin film with an even film quality and an even film thickness on a semiconductor substrate.

Other object of this invention is to provide a plasma CVD film-forming device that is a thin film with an even film quality and thickness for a substrate with a diameter of more 300 mm.

Another object of this invention is further to provide a plasma CVD film-forming device at a low manufacturing cost and with a simple configuration.

To accomplish the above-mentioned objects, a plasma CVD film-forming device according to this invention comprises the following means:

A plasma CVD film-forming device for forming a thin film on a substrate, comprises: (a) a vacuum chamber; (b) a showerhead positioned within said vacuum chamber; and (c) a susceptor positioned substantially in parallel to and facing said showerhead within said vacuum chamber and on which said substrate is loaded, wherein the showerhead and the susceptor are used as electrodes and have surfaces facing each other, at least one of which surfaces is concave.

In the above, in an embodiment, the concave surface is a rotatably symmetrical surface around an axis of the showerhead or the susceptor.

In another embodiment, a distance between said showerhead and said susceptor satisfies the following relation:

$$fd=|dc-da|/da \times 100 \quad fd=1\% \sim 100\%$$

wherein:
 fd is a deformation ratio of the central part of said showerhead's surface that faces said substrate,
 da is the average distance between said showerhead and said susceptor at an outer perimeter position of said substrate, dc is the average distance between said showerhead and said susceptor at a point on a radius of a distance equivalent to da from the center of said substrate.

Further, in yet another embodiment, a distance between said showerhead and said susceptor satisfies the following relation:

$$fd'=|dc'-da'|/da'\times 100 \quad fd'=1\%\sim 100\%$$

wherein:

fd' is a deformation ratio of the central part of said susceptor's surface that faces said substrate, da' is the average distance between said showerhead and said susceptor at an outer perimeter position of said substrate, dc' is the average distance between said showerhead and said susceptor at a point on a radius of a distance equivalent to da' from the center of said substrate.

In an embodiment, a distance between the showerhead and the susceptor becomes greater toward the center and it becomes greatest at the center.

In the above, deformation ratios fd and fd' can range from 1%~100% independently or concurrently. In an embodiment, deformation ratio fd or fd' is 5–35%.

Deformation ratio fd or fd' may be determined to render substantially uniform a distribution of electric field intensity over the substrate while forming a film thereon.

In the above, distance da or da' may be in the range of 3 to 300 mm, preferably 5 to 100 mm. Difference |dc−da|or|dc'−da'| may be in the range of 0.3 to 50 mm, preferably 0.5 to 20 mm.

Deformation ratio fd or fd' can be indicative of uniformity of quality and thickness of a film formed on a substrate. Additionally, a distance, dw, between the susceptor and the substrate can be indicative of quality and uniformity of thickness of a film and may be in the range of 0.1 to 10 mm, preferably 0.1 to 5 mm.

In an embodiment, the susceptor can have a diameter sufficient to support a substrate having a diameter of 300 mm or larger. A film can be formed on a large substrate.

Other conditions for processing a substrate can be the same as those conventionally employed. The showerhead may supply a material gas containing a compound selected from the group consisting of compounds which can be expressed by $Si_xO_yC_zN_lH_m$, wherein x, y, z, l, and m are independently zero or an integer, including $SiH_4$, $Si(OC_2H_5)_4$, $(CH_3)_2Si(OCH_3)_2$, and $C_6H_6$. To the material gas, an additive gas such as He and $O_2$ may be added in an embodiment. A radiofrequency power may be applied between the showerhead and the susceptor. Further, the susceptor may comprise a heater.

The present invention also relates to a method for forming a thin film on a substrate by using the aforesaid plasma CVD film-forming device. The method may comprise: (I) loading a substrate on the susceptor; (ii) controlling the atmosphere in the vacuum chamber; (iii) applying energy between the showerhead and the susceptor; and (iv) forming a thin film on the substrate.

DETAILED DESCRIPTION OF THE PREFERRED EMBODIMENT

Figure 1:
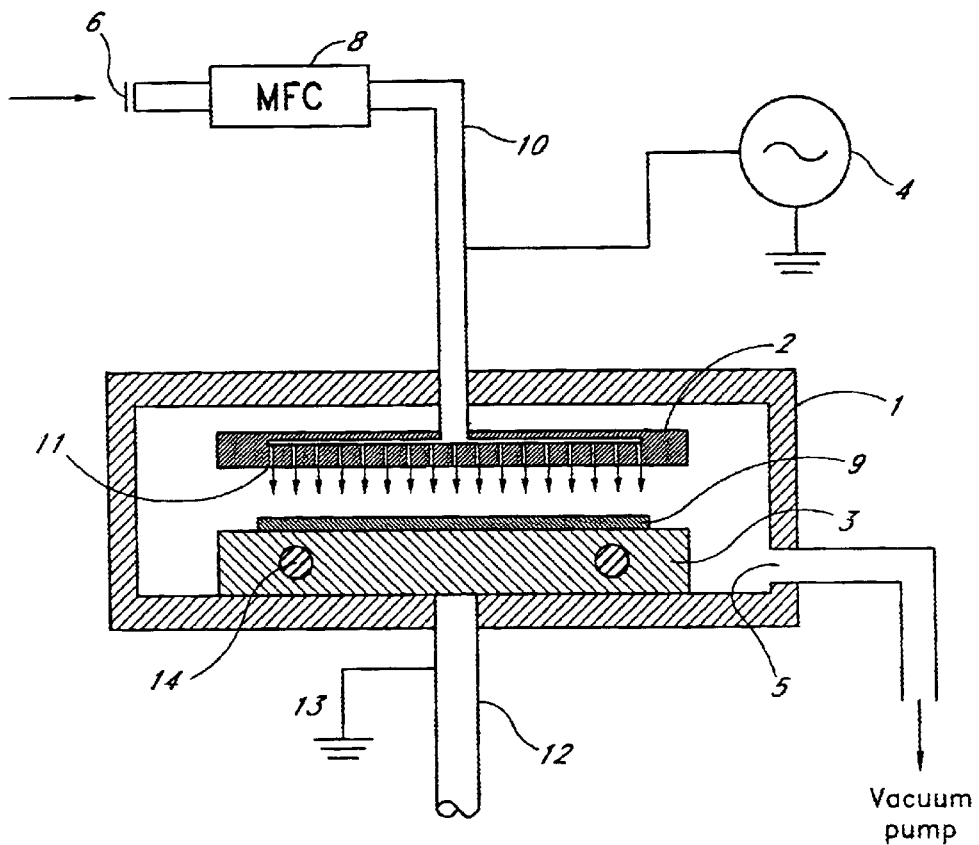
FIG. 1 roughly illustrates a conventional plasma CVD film-forming device.
Figure 2:
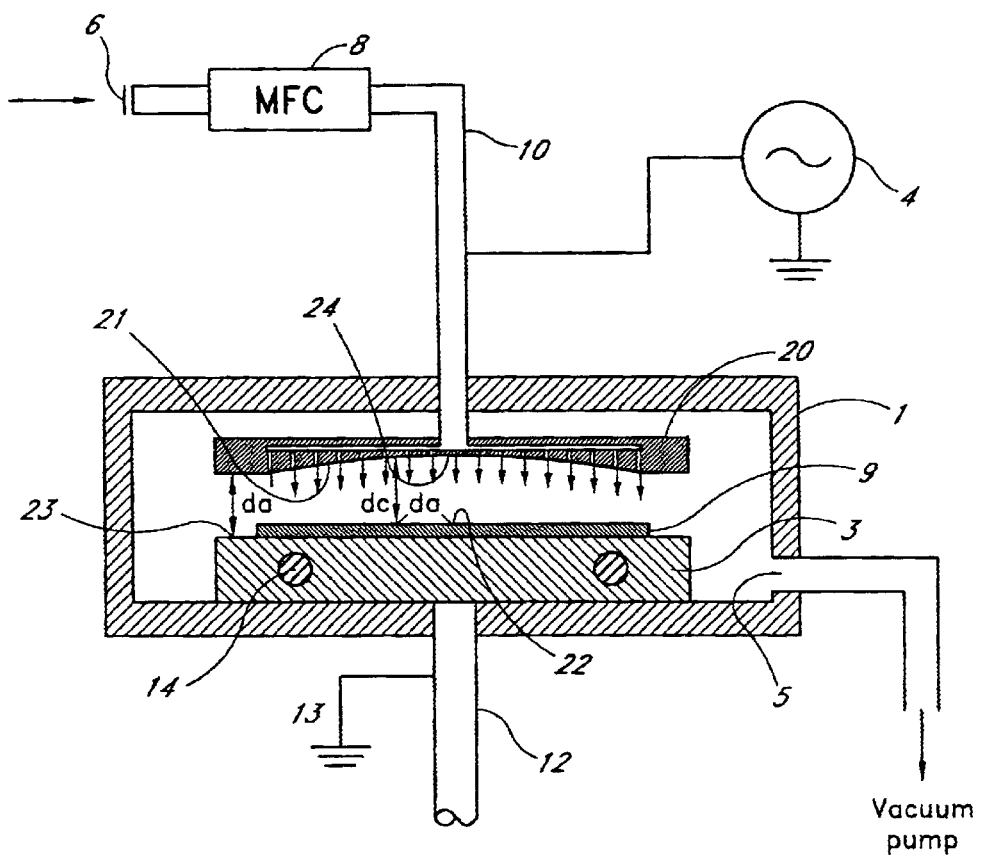
FIG. 2 shows a first example of the plasma CVD film-forming device that possesses a showerhead according to this invention.

This invention is explained referring to the following figures:

FIG. 2 roughly illustrates the first example according to this invention. The same symbols are used for the same materials used in FIG. 1. The first example of a plasma CVD film-forming device for forming a thin film on an object to be processed according to this invention comprises a vacuum chamber 1, a showerhead 20 positioned within said vacuum chamber and a susceptor 3 positioned substantially in parallel to and facing said showerhead within said vacuum chamber and on which susceptor said object to be processed is loaded. This example shows a case where a distance between said showerhead and said susceptor becomes greater toward the center and it becomes the greatest at the center.

The plasma CVD film-forming device shown in FIG. 2 operates in the same way as the conventional plasma CVD film-forming device shown in FIG. 1. However, in this invention, by transforming the surface shape of electrodes, distribution of an electric field within the surface is improved and the evenness o film to be formed is improved.

Preferably, a base 21 of the showerhead 20 comprises a concave rotating surface. Here, a rotating surface is defined as a curved surface that is generated by rotating a curved line on a plane around a straight line on the same plane.

In FIG. 2, a distance between the showerhead 20, i.e., an upper electrode, and the semiconductor substrate 9 is the greatest at the central point 22 and gradually lessens toward the outer edge along a radius.

The deformation ratio fd of the center 24 of the upper electrode 21 is defined as follows:

$$fd=|dc-da|/da\times 100 \quad fd=1\%\sim 100\%$$

wherein:

fd is a deformation ratio of the central part 24 of the surface of the showerhead 20, which faces the semiconductor substrate 9, da is the average distance between the showerhead 20 and the susceptor 3 at an outer perimeter position 23 of the semiconductor substrate 9, dc is the average distance between the showerhead 20 and the susceptor 3 at a point on a radius of a distance equivalent to da from the center 22 of the semiconductor substrate 9. A deformation ratio fd according to this invention is fd=1%~100%, preferably 5~35%. The deformation ratio fd differs according to the type of reaction gas supplied, the mixing ratio, the RF power applied, and other factors, and the most suitable value is selected.

Figure 3A:
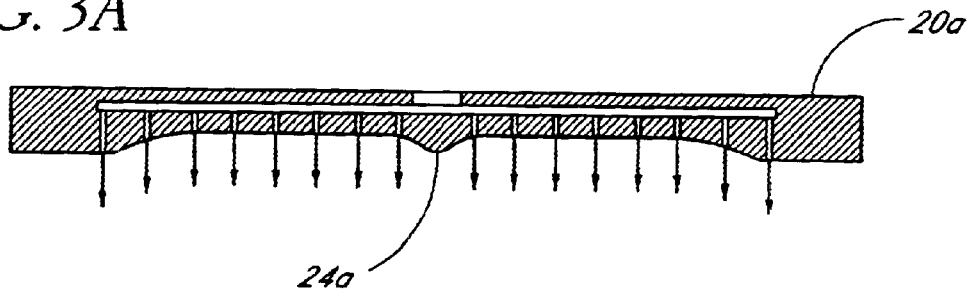
FIGS. 3a, 3b, and 3c show variation examples of a showerhead according to this invention.
Figure 3B:
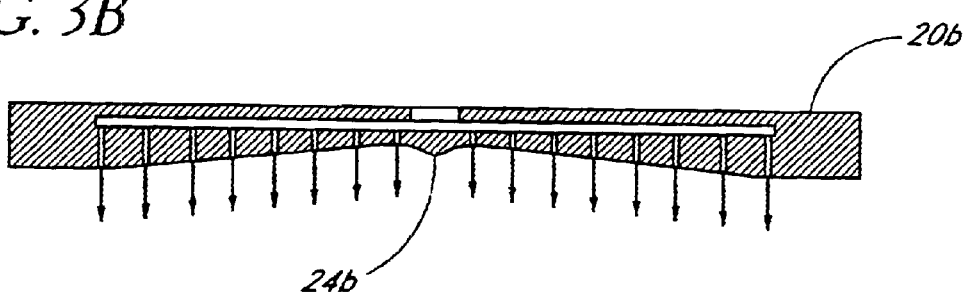
Figure 3C:
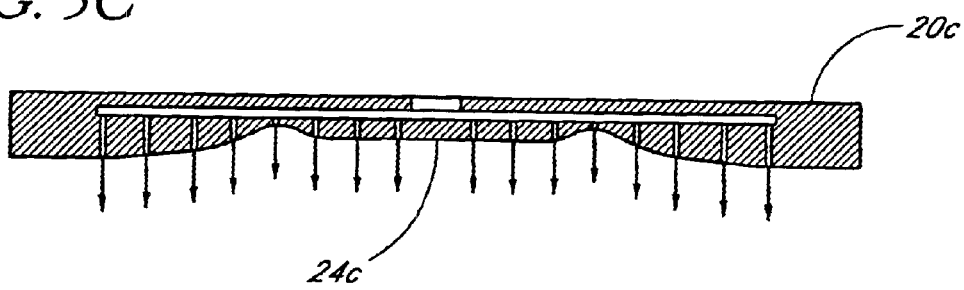

FIG. 3 shows variation[ example]s of the above-mentioned first example of this invention. In the first variation example shown in FIG. 3(a), the base of the showerhead 20 comprises a rotating surface whose part facing the semiconductor substrate is largely concave with its center 24a protruding. In the second variation example shown in FIG. 3(b), the base of the showerhead 20b is concave in a substantially conical shape and its center 24b protrudes. In the third variation example shown in FIG. 3(c), the base of the showerhead 20c has two concave parts and the center 24c is nearly flat.

Thus, the structure of the showerhead 20 of this invention is not restricted to the one shown in the first example, for which a distance between the showerhead 20 and the susceptor 3 becomes greatest at the center. In other words, the structure of the showerhead according to this invention is substantially characterized in the regard that the part facing the semiconductor substrate is concave, and for that concave structure, the most suitable one is selected according to the specifications of the showerhead and the susceptor, the RF power, and other film-forming conditions.

Figure 4:
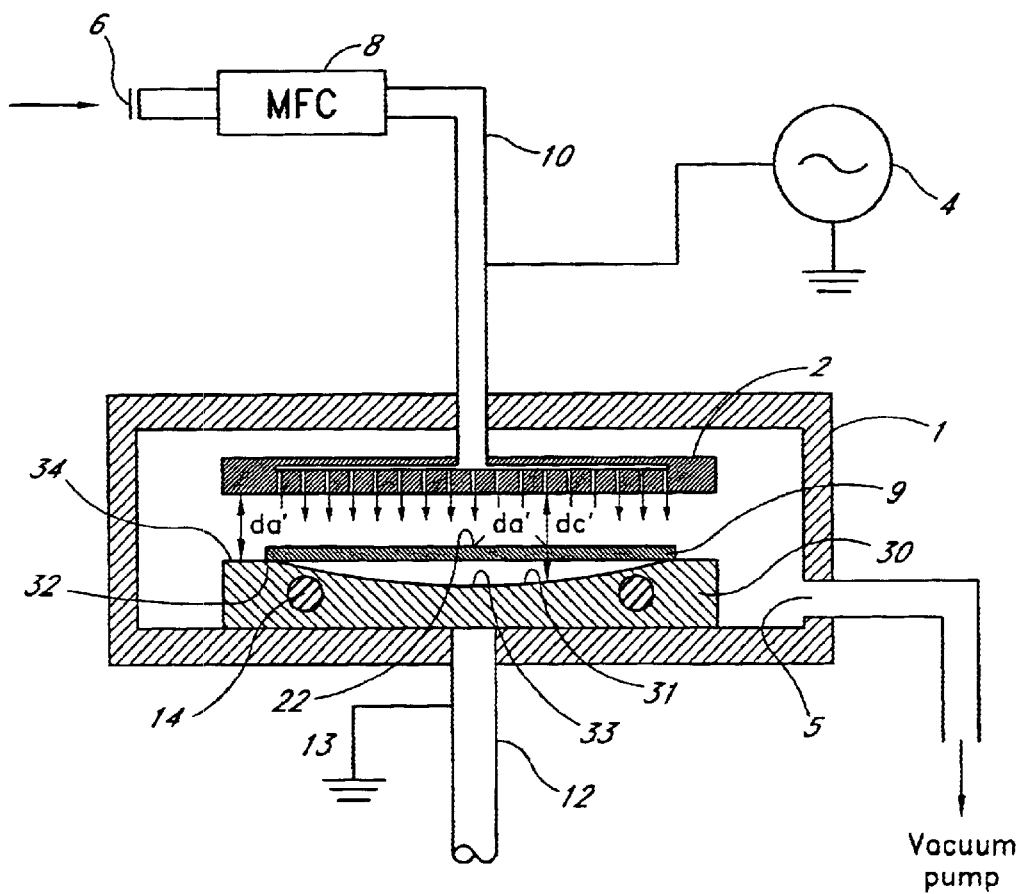
FIG. 4 shows a second example of the plasma CVD film-forming device according to this invention.

FIG. 4 roughly illustrates the second example of this invention. This works in the same as a conventional plasma CVD film-forming device, but in this second example, the surface 31 of the susceptor 30 comprises a concave rotating surface. The showerhead 2 is the same flat-type showerhead and constitutes the upper electrode. The distance between the susceptor 30, i.e., the lower electrode, and the showerhead 2 is greatest at the central point 33 and gradually lessens toward the outer edge along a radius. The semiconductor substrate 9 contacts the susceptor solely at its rim 32, and it can be fixed by, for example, vacuum fastening.

The deformation ratio fd' of the central part of the lower electrode 30 is defined as follows:

$$fd'=|dc'-da'|/da' \times 100$$

wherein:

fd' is the deformation ratio of the central part of the surface of the susceptor 30, which faces the semiconductor substrate 9, da' is the average distance between the showerhead 2 and the susceptor 30 at the outer perimeter position 34 of the semiconductor substrate 9, dc' is the average distance between the showerhead 20 and the susceptor 30 at a point on a radius of a distance equivalent to da' part from the center 22 of the semiconductor substrate 9. The deformation ratio fd' according to this invention is fd'=1~100%, preferably 5~35%. The deformation ratio fd' differs according to the type and mixing ratio of reaction gas, the RF power applied, and other factors, and the most suitable value is selected.

At this point it should be noted that a variation example similar to the variation example of the first example shown in FIG. 3 is applicable to the susceptor 30 of this invention. In other words, the structure of the susceptor 30 of this invention is not restricted to those shown in the second example, for which the distance between the showerhead and the susceptor becomes greatest at the central part.

Figure 5:
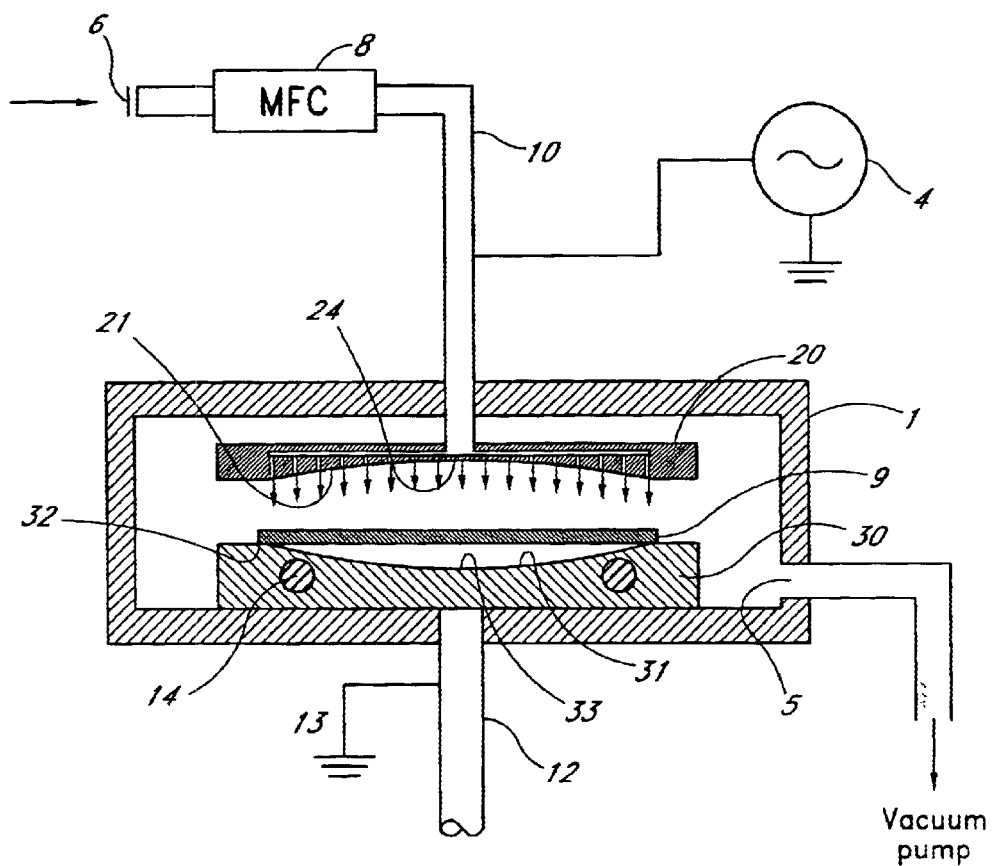
FIG. 5 shows a third example of the plasma CVD film-forming device according to this invention.

Next, the third example of this invention is roughly illustrated in FIG. 5. This works in the same way as a conventional plasma CVD film-forming device, but in the third example, the respective surfaces 21 and 31 of the showerhead 20 and the susceptor 30 comprise concave rotating surfaces. The showerhead 20 has the same rotating surface 21, which is concave at the center, as that of the first example and it constitutes the upper electrode. Similarly to the second example, the susceptor 30 comprises a rotating surface that is concave at the center. The distance between the susceptor 30 and the showerhead 20 is greatest between respective central points 33 and 24 and it gradually lessens toward the outer edge along a radius. The semiconductor substrate 9 contacts the susceptor only at its rim 32 and is fixed by, for example, vacuum fastening.

The deformation ratio fd for the third example according to this invention is fd=1~100%, preferably 5~35% (in another embodiment, fd=10~35%). The deformation ratio fd differs according to the type and mixing ratio of reaction gas, the RF power applied, and other factors, and the most suitable value is selected.

EXAMPLE

The experimental results of this invention are explained below.

The experiment intends to measure each film thickness distribution obtained using two types of showerheads according to the first example of this invention.

Figure 6:
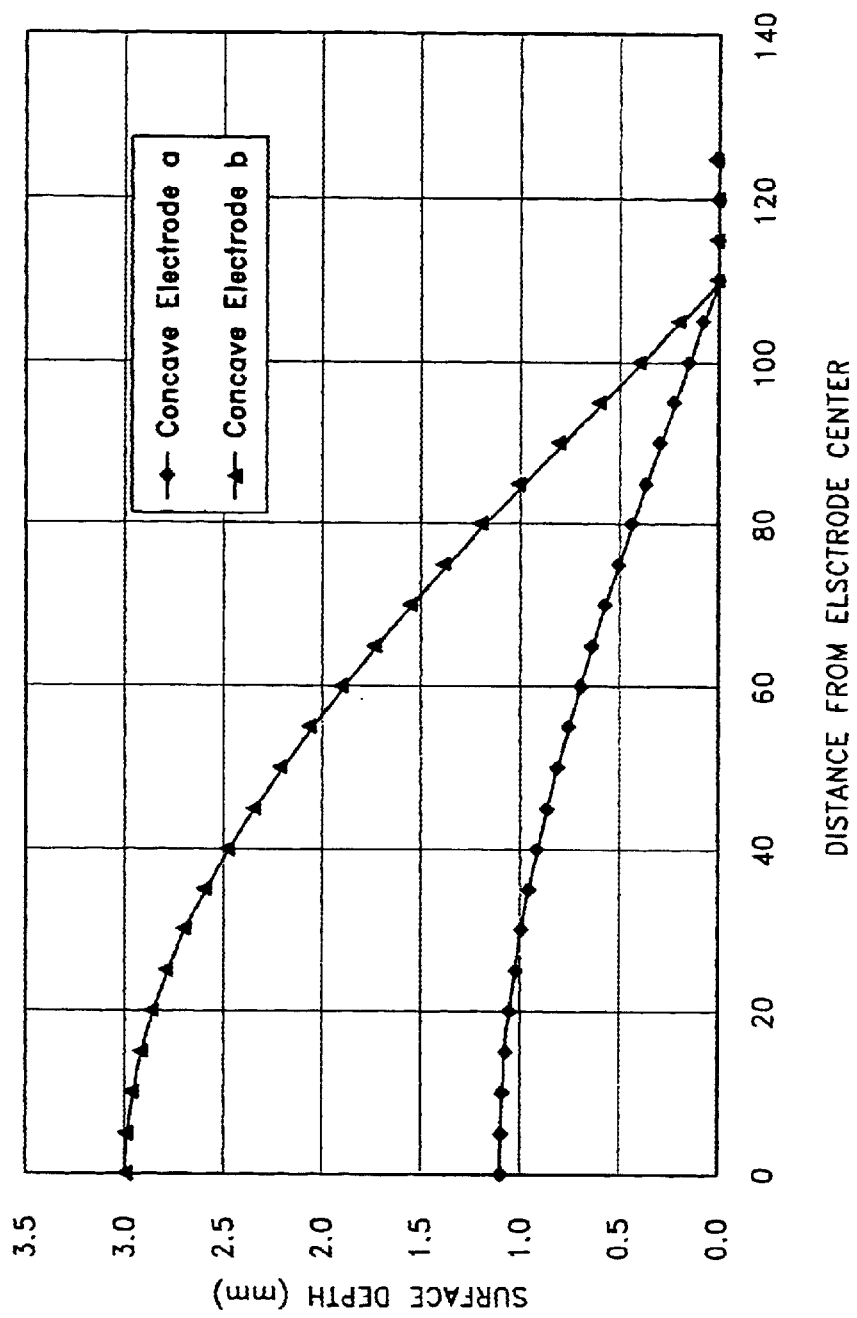
FIG. 6 is a graph showing the relation of the surface depth and a distance from the electrode center according to the difference in the showerhead lower surface shape.

FIG. 6 is a graph showing the shape of the surface of each showerhead. Rotating surfaces on the showerhead base are formed by rotating the respective shapes a and b on the central axis of the electrode used as a rotating axis. As a result, a difference results in the electrode interval toward the radius.

The experiment was conducted under the following conditions:

Distance da between the electrodes at the outer rim of the semiconductor substrate=10 mm The depth of the concave surface at the center 24 of the showerhead a (the degree of concavity)=1 mm, deformation ratio fd=11%

The depth of the concave surface at the center 24 of the showerhead b (the degree of concavity)=3 mm, deformation ratio fd=32%

Ø of the semiconductor substrate used=200 mm

Temperature at the lower electrode=400° C. (752° F.)

Frequency f of RF power source used=13.56 MHz

Material gas=DM-DMOS, flow=20 sccm

Material gas=Ar, flow=10 sccm

Material gas=He, flow=10 sccm

Figure 7:
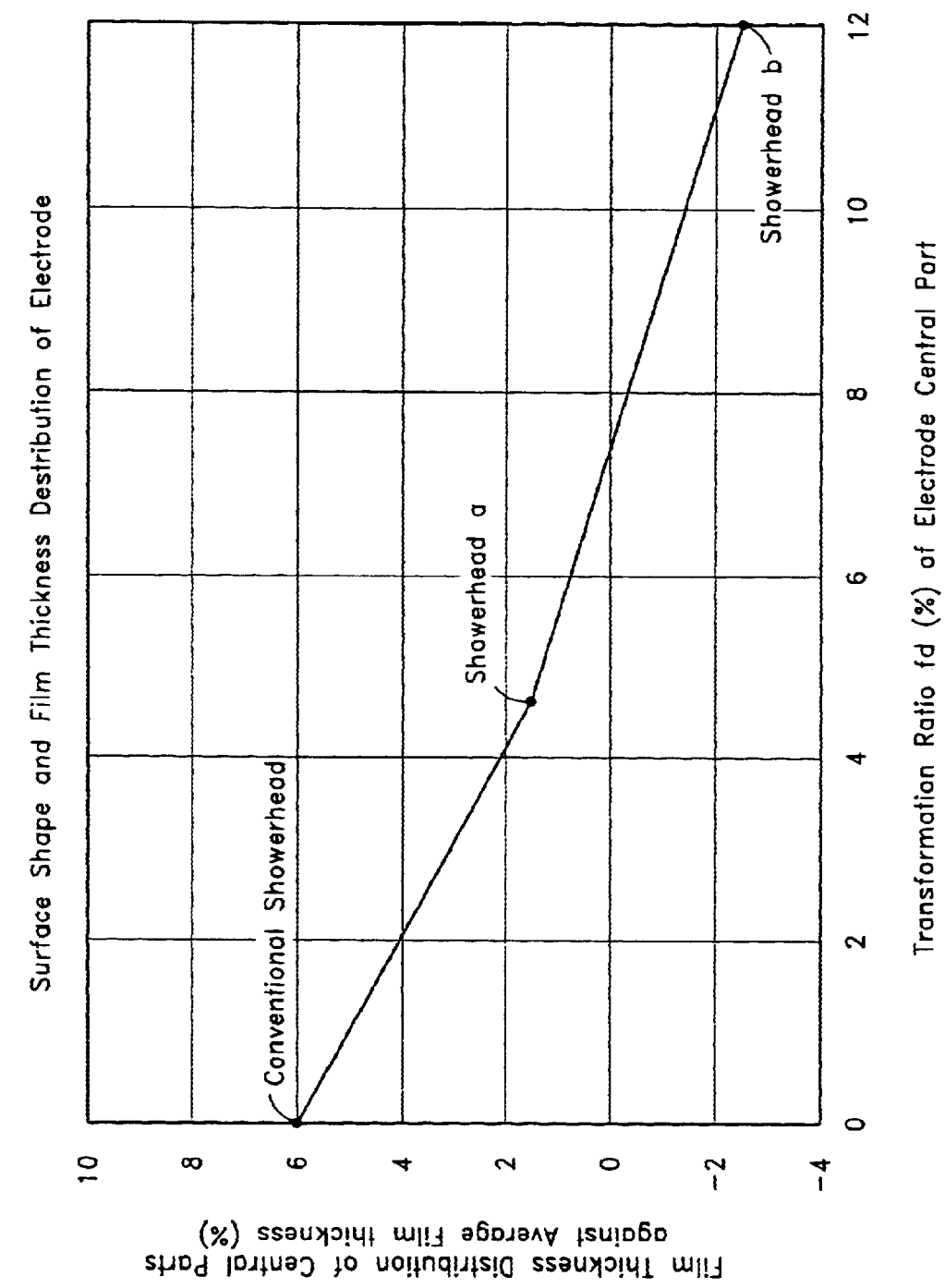
FIG. 7 is a graph showing the relation of the degree of concavity at the central part of the electrode and the film thickness of the semiconductor substrate center.

From the experimental results shown in FIG. 7, while the film thickness accumulated on the semiconductor substrate around the central part of the showerhead electrode was approximately 6% thicker for a conventional parallel-flat-plate type plasma CVD film-forming device than the average film thickness, the film thickness accumulated on the semiconductor substrate around the central part of the showerhead according to this invention was improved to remain 1.5% thicker than the average film thickness and the film thickness of a thin film accumulated on the semiconductor substrate around the central part of the showerhead b resulted conversely in a 2.5% thinner than [the] average film thickness.

From these experimental results, it was found that the evenness of a film could be improved by forming electrodes so that the distance between the electrodes becomes greater around the central part of the semiconductor substrate, thereby adjusting the plasma electric field to evenly distribute its intensity.

Alternatively, the direction of thermal expansion of the electrodes when forming a film on the semiconductor substrate changes in the direction of narrowing the electrode interval, or conversely, in the direction of widening it according to a method of fixing the outer perimeter of electrodes, residual stress of an electrode surface, subtle deflection of a surface shape or a shape of a fine hole for supplying reaction gas, etc.

Conventionally, it was difficult to control changes in this direction to be constant at all times. If the distance between the electrodes is shortened, the electric field around the central part of the semiconductor substrate becomes very strong, the growth rate of the film also increases and the evenness of the film deteriorates.

However, according to this invention, by making the structure of the central part concave from the beginning, the evenness of the film around the semiconductor substrate center further improves because the electrodes expand only in the direction of widening the electrode interval.

Effects of the Invention

With an embodiment of the plasma CVD film-forming device according to this invention, it has become possible to form a thin film on a semiconductor substrate evenly. As a result, demand for more highly integrated and higher performance semiconductor elements can be addressed.

Moreover, with an embodiment of the plasma CVD film-forming device according to this invention, demand for more even and stable film thickness and film quality can be addressed.

Furthermore, an embodiment of the plasma CVD film-forming device according to this invention makes it possible to sufficiently address a larger diameter of future semiconductor substrates and to form a thin film evenly across a wide area.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A plasma CVD film-forming for forming a tin film on a flat substrate, which comprises:

a vacuum chamber;

a showerhead positioned within said vacuum chamber, from which a reaction gas is discharged substantially uniformly with respect to its surface; and a susceptor positioned substantially in parallel to and facing said showerhead within said vacuum chamber, wherein the surface of said showerhead is concave, and a distance between said showerhead and said susceptor satisfies the following relation:

$$fd = |dc - da|/da \times 100 \quad fd = 1\% - 100\%$$

wherein:

fd is a deformation ratio of the central part of said showerhead's surface that faces said substrate, da is the average distance between said showerhead and a plane defined by an outer perimeter position of said susceptor, dc is the average distance between said showerhead and said plane at a point on a radius of a distance equivalent to da from the center of said plane, wherein fd is configured to render substantially uniform a distribution of electric filed intensity over the flat substrate while forming a film thereon, wherein the surface of said susceptor is concave, and a distance between said showerhead and said susceptor satisfies the following relation:

$$fd' = |dc' - da'|/da' \times 100 \quad fd' = 1\% - 100\%$$

wherein:

fd' is a deformation ratio of the central part of said susceptor's surface that faces said substrate, da' is the average distance between said susceptor and a plane defined by an outer perimeter position of said showerhead, dc' is the average distance between said susceptor and said plane at a point on a radius of a distance equivalent to da' from the center of said plane, wherein fd' is configured to render substantially uniform a distribution of electric filed intensity over the flat substrate while forming a film thereon, and the substrate contacts said susceptor only at a lower rim of the substrate while forming the film, and the substrate remains substantially flat during the process.

2. The plasma CVD film-forming device according to claim 1, wherein the concave surface of the showerhead is a rotatably symmetrical surface around an axis of the showerhead.

3. The plasma CVD film-forming device according to claim 1, wherein deformation ratio fd is 5–35%.

4. The plasma CVD film-forming device according to claim 1, wherein distance da is in the range of 3 to 300 mm.

5. The plasma CVD film-forming device according to claim 1, wherein distance dc is in the range of 3.3 to 350 mm.

6. The plasma CVD film-forming device according to claim 1, wherein deformation ratio fd' is 5–35%.

7. The plasma CVD film-forming device according to claim 1, wherein distance da' is in the range of 3 to 300 mm.

8. The plasma CVD film-forming device according to claim 1, wherein distance dc' is in the range of 3.3 to 350 mm.

9. The plasma CVD film-forming device according to claim 1, wherein the concave surface of the susceptor is a rotatably symmetrical surface around an axis of the susceptor.

10. The plasma CVD film-forming device according to claim 1, wherein the showerhead supplies a material gas containing a compound selected from the group consisting of compounds which can be expressed by $Si_xO_yC_zN_1H_m$, wherein x, y, z, 1, and m are independently zero or an integer, including $SiH_4$, $Si(OC_2H_5)_4$, $(CH_3)_2Si(OCH_3)_2$, and $C_6H_6$.

11. The plasma CVD film-forming device according to claim 1, wherein the susceptor has a diameter sufficient to support a substrate having a diameter of 300 mm or larger.

12. The plasma CVD film-forming device according to claim 1, wherein an radiofrequency power is applied between the showerhead and the susceptor.

13. The plasma CVD film-forming device according to claim 1, wherein the susceptor comprises a heater.

* * * * *

UNITED STATES PATENT AND TRADEMARK OFFICE
CERTIFICATE OF CORRECTION

PATENT NO. : 6,631,692 B1
DATED : October 14, 2003
INVENTOR(S) : Nobuo Matsuki and Yoshinori Morisada Page 1 of 1

It is certified that error appears in the above-identified patent and that said Letters Patent is hereby corrected as shown below:

<u>Column 7,</u>
Line 52, delete "fd = dc - da | /da x 100  fd=1%-100%" and insert
-- fd = | dc - da | /da x 100   fd=1%-100% --.

Signed and Sealed this

Fifteenth Day of June, 2004

JON W. DUDAS
*Acting Director of the United States Patent and Trademark Office*